(12) United States Patent
Franiatte et al.

(10) Patent No.: US 11,923,256 B2
(45) Date of Patent: Mar. 5, 2024

(54) CAP FOR PACKAGE OF INTEGRATED CIRCUIT

(71) Applicant: STMicroelectronics (Grenoble 2) SAS, Grenoble (FR)

(72) Inventors: Olivier Franiatte, Grenoble (FR); Richard Rembert, Quaix en Chartreuse (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 256 days.

(21) Appl. No.: 17/378,398

(22) Filed: Jul. 16, 2021

(65) Prior Publication Data

US 2021/0343609 A1 Nov. 4, 2021

Related U.S. Application Data

(62) Division of application No. 16/551,241, filed on Aug. 26, 2019, now Pat. No. 11,101,188.

(30) Foreign Application Priority Data

Sep. 4, 2018 (FR) ...................................... 1857919

(51) Int. Cl.
| | |
|---|---|
| *H01L 23/538* | (2006.01) |
| *H01L 21/56* | (2006.01) |
| *H01L 23/04* | (2006.01) |
| *H01L 23/498* | (2006.01) |
| *H01L 21/60* | (2006.01) |
| *H01L 21/603* | (2006.01) |

(52) U.S. Cl.
CPC .............. *H01L 23/04* (2013.01); *H01L 21/56* (2013.01); *H01L 23/49816* (2013.01); *H01L 23/5385* (2013.01); *H01L 2021/60022* (2013.01); *H01L 21/603* (2021.08)

(58) Field of Classification Search
CPC ....... H01H 21/56; H01L 23/538; H01L 23/04; H01L 21/56
See application file for complete search history.

(56) References Cited

U.S. PATENT DOCUMENTS

| | | | |
|---|---|---|---|
| 4,166,665 A | 9/1979 | Cutchaw | |
| 5,473,512 A | 12/1995 | Degani et al. | |
| 5,739,584 A * | 4/1998 | Pasch | H01L 23/057 257/E23.068 |
| 6,000,120 A | 12/1999 | Arledge et al. | |
| 2009/0152741 A1 * | 6/2009 | Chang | H01L 25/0657 257/E21.59 |
| 2011/0241192 A1 | 10/2011 | Ding et al. | |

FOREIGN PATENT DOCUMENTS

CN 105244314 A 1/2016

* cited by examiner

*Primary Examiner* — Dale E Page
*Assistant Examiner* — Wilner Jean Baptiste
(74) *Attorney, Agent, or Firm* — Slater Matsil, LLP

(57) ABSTRACT

A cover for an integrated circuit package includes a central plate and a peripheral frame surrounding the central plate. The peripheral frame is vertically spaced from and parallel to the central plate. The peripheral frame includes through openings formed therein. The cover can be used to package a semiconductor chip that is mounted to a substrate.

22 Claims, 1 Drawing Sheet

CAP FOR PACKAGE OF INTEGRATED CIRCUIT

CROSS-REFERENCE TO RELATED APPLICATIONS

This application is a divisional application of U.S. application Ser. No. 16/551,241, filed Aug. 26, 2019, which claims priority to French Patent Application No. 1857919, filed on Sep. 4, 2018, which applications are hereby incorporated herein by their reference.

TECHNICAL FIELD

The present disclosure generally concerns electronic circuits and, in particular embodiments, to a cap for an integrated circuit package.

BACKGROUND

An integrated circuit electronic chip comprises a semiconductor wafer portion, typically made of silicon, having circuits formed inside and of top of it. Such a chip is often housed in a package comprising a substrate having the chip affixed thereon, and a cover covering the chip.

SUMMARY

An embodiment overcomes all or part of the disadvantages of known covers for integrated circuit packages.

An embodiment overcomes all or part of the disadvantages of known integrated circuit packages.

An embodiment provides a cover for an integrated circuit package, comprising peripheral through openings.

According to an embodiment, the cover is metallic.

According to an embodiment, the openings have an elongated shape parallel to edges of the cover.

According to an embodiment, at least two of the openings are separated by a distance shorter than five times the width of the two openings, the width being in the direction orthogonal to the longitudinal direction of the two openings.

According to an embodiment, the cover comprises a peripheral frame having a planar surface.

According to an embodiment, the openings are located in the peripheral frame.

According to an embodiment, the cover comprises a central plate parallel to the planar surface.

According to an embodiment, the central plate is coupled to the frame by an inclined portion.

An embodiment provides a package for an integrated circuit comprising a cover such as defined hereabove.

According to an embodiment, the package comprises a substrate glued to the cover by glue partially located in the openings.

According to an embodiment, the substrate, the cover, and the glue define a tight space.

According to an embodiment, the package is of BGA type.

An embodiment provides an electronic circuit comprising a package such as defined hereabove.

According to an embodiment, the circuit comprises an electronic chip coupled to the cover by thermally conductive paste.

According to an embodiment, the chip is soldered or welded to contacts of the substrate by solder balls.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
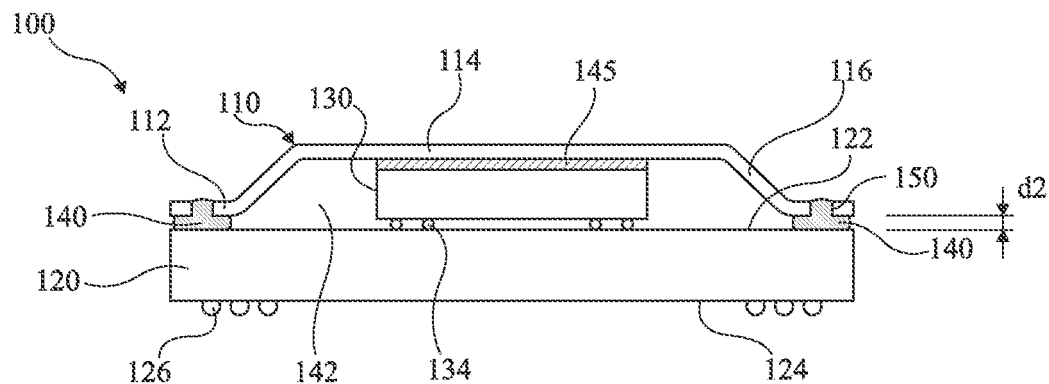
FIG. 1 shows a cross-section view of an embodiment of a package.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the electronic chips and their circuits are not described, the described embodiments being compatible with usual electronic chips.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "top", "bottom", "left", "right", etc., or relative positions, such as terms "above", "under", "upper", "lower", etc., or to terms qualifying directions, such as terms "horizontal", "vertical", etc., unless otherwise indicated, it is referred to the orientation of the drawings.

The terms "about", "substantially", and "approximately" are used herein to designate a tolerance of plus or minus 10%, preferably of plus or minus 5%, of the value in question.

Figure 2:
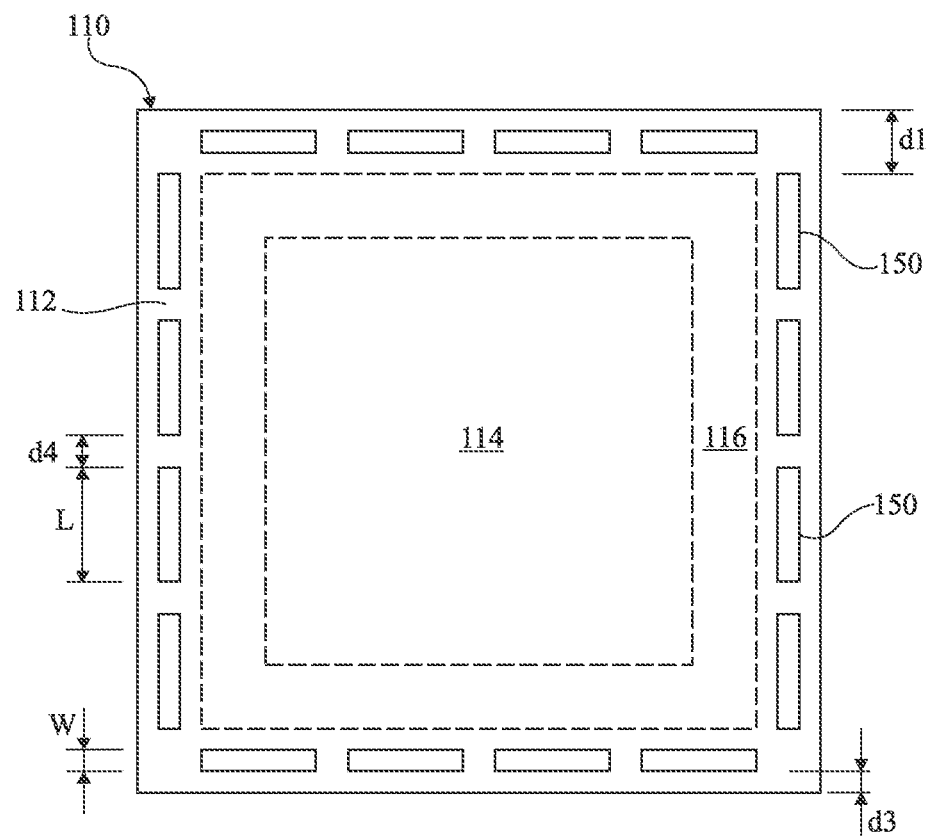
FIG. 2 shows a top view of a cover of the package.

FIG. 1 shows a cross-section view of an embodiment of a package 100. FIG. 2 shows a top view of a cover 110 of package 100.

Package 100 comprises a substrate 120 having cover 110 glued thereto. Preferably, substrate 120 comprises a polymer material such as a resin, for example, of epoxy type. The polymer material is, for example, mixed with fiberglass. The substrate, for example, comprises copper tracks and external protection layers. Preferably, the substrate is plate-shaped, that is, comprises two opposite parallel main surfaces 122 and 124. The two surfaces are preferably planar.

The package is intended to receive a chip 130 located on substrate 120 on the side of surface 122 thereof (upper surface). The chip comprises a silicon wafer portion (i.e., a die). Circuits, not shown, for example comprising a microprocessor, are formed in the chip on a front surface side (lower surface) of chip 130. The circuits are electrically connected to solder balls 134. Balls 134 are preferably located between the front surface of the chip and surface 122 of the substrate. As a variation, the rear surface is the lower surface of the chip, and balls 134 are located between the back side and surface 122 of substrate 120.

Substrate 120 comprises, on its surface 122, contacts, not shown, having balls 134 soldered or welded thereto. Electric conductors (not shown) located in substrate 120 couple these contacts to solder balls 126 located on surface 124 of substrate 120. Balls 126 are intended to be welded or soldered to an electronic circuit, not shown, external to the package, for example, a PCB-type circuit ("Printed Circuit Board"). The package is preferably of ball grid array type, BGA, that is, balls 126 are arranged in regular rows and columns on a peripheral portion of surface 124 or on the entire surface 124.

Cover 110 is glued to surface 122 of substrate 120. Preferably, the periphery of cover 110 is glued to the periphery of surface 122 by glue 140, that is, by a polymer material bonding to the glued elements.

Preferably, the cover comprises a peripheral frame 112 glued to surface 122, and a central plate 114. Plate 114 is preferably parallel to surface 122 of the substrate. In other words, frame 112 and plate 114 follow planes parallel to each other and to the substrate. Peripheral frame 112 preferably has a planar surface on the side of surface 122. The peripheral frame extends from edges of the cover over a distance d1 preferably in the range from 1 to 4 mm.

Preferably, frame 112 and plate 114 have the same thickness. An oblique portion 116 couples the frame located at a lower level and the central plate located at an upper level. The oblique portion preferably has two parallel surfaces forming with the surfaces of the substrate and of the frame an angle preferably in the range from 40 to 80 degrees.

The substrate, the glue, and the cover delimit a space 142 containing chip 130. Central plate 114 covers chip 130. Preferably, a thermal paste 145, that is, a soft material for example having a thermal conductivity greater than 0.5 W/m/K at 25° C., is arranged between the chip and the cover, preferably between the chip and plate 114. The cover is preferably metallic, for example, made of aluminum. The cover enables to dissipate the thermal power generated by the chip during the operation thereof. The cover may comprise heat dissipation devices, not shown, such as cooling fins, or be coupled to a heat dissipation device such as a fin-type radiator. Cover no is compatible with usual heat dissipation devices. The cover has, in top view, a shape, for example, rectangular, preferably square. Preferably, the cover has a side length in the range from 10 to 70 mm.

In the present embodiment, cover 110 comprises peripheral through openings 150. Openings 150 are preferably regularly distributed along the edges of cover 110, preferably in frame 112.

Openings 150 are intended, among others, to absorb and/or to discharge excess glue. Risks of an excessive thickness of glue under frame 112 and/or of glue bleeds upon assembly are thus avoided. Openings 150 further enable to deposit the glue and to receive the deposited glue.

Due to openings 150, an excess of glue with respect to the quantity just necessary to glue cover 110 to substrate 120 may be provided. The glue dosage is thus easier than in the absence of openings. Preferably, it is provided for the glue to be in excess with respect to the quantity necessary to obtain a homogeneous gluing, uniform along the entire periphery of cover 110. A homogeneous gluing enables to obtain a tightness between frame 112 and substrate 120. Space 142 is then tight. Openings 150 contain, after assembly, part of the excess glue. The excess glue may be entirely comprised in openings 150 or may protrude from the upper level of openings 150.

The height of chip 130, the height of balls 134 after soldering/welding of chip 130, the possible thickness of thermal paste 145, and the height difference between peripheral frame 112 and plate 114 of the cover depend on manufacturing tolerances. Thus, distance d2 between frame 112 and surface 122 of substrate 120 depends on manufacturing tolerances. A quantity of glue greater than the quantity necessary to obtain a homogenous gluing in the configuration where distance d2 is maximum given the manufacturing tolerances is preferably provided. Such a quantity of glue for example corresponds to the maximum distance d2 multiplied by the surface area of frame 112. In cases where distance d2 is not maximum, part of the glue is in excess. Openings 150 thus enable, with no risk of glue bleed or of excessive thickness of glue, a tight gluing for any possible distance d2 given the manufacturing tolerances.

Further, when the cover and the substrate are superposed, that is, have coinciding edges in top view, the presence of glue bleeds which might make the outer dimensions of the package greater than the expected dimensions is avoided.

In the forming of the package, chip 130 is preferably soldered to substrate 120 before the gluing of cover 110 to the substrate. Chip 130 is then preferably covered with thermal paste 145.

As an example, to glue cover 110 to substrate 120, glue 140 is deposited on the periphery of the substrate, after which cover 110 is arranged in place. Cover no is pressed on. The thermal contact is thus simultaneously formed through thermal paste 145 between chip 130 and cover 110. Openings 150 allow a gluing with a lower pressure on the cover than in the absence of openings. This avoids the electronic chip from breaking, cracking or becoming brittle during the gluing of the cover.

As a variation, to glue cover 110 to substrate 120, cover 110 is arranged in place, after which glue 140 is deposited into the openings. The glue then spreads under frame 112. According to an advantage, cover 110 can thus be glued without pressing. Risks of damaging the chip are thus particularly limited.

A distance d3, for example common for the openings close to a same edge, preferably common for all openings, is provided between each opening 150 and the edge of the cover closest to the opening. Distance d3 is for example in the range from 0.1 mm to 1 mm, preferably in the range from 0.2 mm to 0.5 mm.

Each opening 150 preferably has an elongated shape parallel to the edge closest to the opening. Preferably, the edge is rectilinear and the opening is elongated in a direction parallel to the edge. Preferably, the opening has a rectangular shape. As a variation, at least a portion of the edge is curved, for example in a rounded portion of a corner of the cover, and opening 150 has a curved elongated shape, for example the edge of the opening comprises two arcs curved parallel to the edge.

Each opening 150 has, in the direction orthogonal to the closest edge, a width W. The openings preferably have the same width W. The width of the openings is for example smaller than 3 times distance d1, and preferably smaller than distance d3.

Each opening has, in the direction parallel to the closest edge, a length L. The openings preferably have the same length L. Length L is for example in the range from 10% and half of the side length of the cover. In a variation, for a triangular or square cover shape, the eight openings closest to the angles may each have a length shorter than a length common to the other openings. In another variation, each opening has a length greater than approximately 80%, preferably greater than 90% of the side length. In this variation, there thus is a single opening for each side of the cover.

Preferably, neighboring openings are separated by a distance d4 shorter than approximately 5 times width W, for example, shorter than 5 times width W, preferably shorter than 3 times width W. Thus, when the glue is deposited before the cover is installed, the openings are sufficiently close to one another to avoid bleeds of the glue located between the openings before assembly. Further, when glue is deposited in the openings after the cover is installed, the openings are sufficiently close to obtain a homogeneous gluing.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of packaging a semiconductor chip, the method comprising:
    soldering the chip to a substrate;
    arranging a cover over the substrate and the chip, the cover including a central plate overlying the chip and a peripheral frame surrounding the central plate, the peripheral frame including through openings formed therein; and
    gluing the peripheral frame to peripheral regions of the substrate so that glue is formed in the through openings.

2. The method of claim 1, further comprising:
    depositing glue on the peripheral regions of the substrate prior to arranging the cover over the substrate and the chip; and
    pressing the cover toward the substrate and the chip after arranging the cover over the substrate and the chip, wherein the gluing is performed while pressing the cover toward the substrate.

3. The method of claim 1, further comprising covering the chip with a thermal paste before arranging the cover over the substrate and the chip, wherein the cover is thermally contacted to the chip after the gluing.

4. The method of claim 1, wherein the openings have an elongated shape parallel to edges of the peripheral frame.

5. The method of claim 1, wherein the central plate and the peripheral frame are made of metal.

6. The method of claim 1, wherein two of the openings are separated by a distance shorter than 5 times a width of the two openings, the width being in a direction orthogonal to a longitudinal direction of the two openings.

7. The method of claim 1, wherein the central plate is coupled to the peripheral frame by an inclined portion.

8. The method of claim 1, further comprising attaching solder balls to a lower surface of the substrate, the solder balls being electrically connected to circuitry of the semiconductor die.

9. The method of claim 1, further comprising attaching the semiconductor die to an upper surface of the substrate by solder balls.

10. The method of claim 1, further comprising coupling the semiconductor die to the cover with a thermally conductive paste.

11. The method of claim 10, further comprising soldering or welding the semiconductor die to contacts of the substrate by solder balls, the contacts of the substrate being electrically coupled to solder balls attached to a lower surface of the substrate via conductive vias extending through the substrate.

12. The method of claim 1, wherein cover is substantially in the shape of a square having four sides, each side having a length in the range from 10 to 70 mm.

13. The method of claim 1, wherein the peripheral frame has a width and wherein each of the openings has a width that is less than one third of the width of the peripheral frame.

14. The method of claim 1, wherein the cover is in the shape of a rectangle or a square having four sides and wherein each side of the peripheral frame includes a plurality of through openings.

15. The method of claim 1, wherein the cover is in the shape of a rectangle or a square having four sides and wherein each side of the peripheral frame includes a single through opening having a length greater than approximately 80% of the length of the side.

16. A method of packaging a semiconductor chip, the method comprising:
    soldering the chip to a substrate;
    arranging a cover over the substrate and the chip, the cover including a central plate overlying the chip and a peripheral frame surrounding the central plate, the peripheral frame including through openings formed therein; and
    gluing the peripheral frame to peripheral regions of the substrate so that glue is formed in the through openings, wherein gluing the peripheral frame to the peripheral regions of the substrate comprises depositing glue into the through openings after arranging the cover over the substrate and the chip.

17. The method of claim 16, wherein the cover is not pressed into the chip after the gluing.

18. A method of packaging a semiconductor chip, the method comprising:
    attaching a semiconductor die to an upper surface of a substrate; and
    attaching a cover overlying the semiconductor die, the cover including a central plate and a peripheral frame physically attached to the substrate, the peripheral frame including through openings formed therein, the central plate and the peripheral frame being made of metal.

19. The method of claim 18, wherein each of the through openings has an elongated shape parallel to edges of the peripheral frame.

20. The method of claim 19, wherein two of the through openings are separated by a distance shorter than 5 times a width of the two through openings, the width being in a direction orthogonal to a longitudinal direction of the two through openings.

21. The method of claim 18, wherein the peripheral frame has a width and wherein each of the through openings has a width that is less than one third of the width of the peripheral frame.

22. The method of claim 18, wherein the cover is in the shape of a rectangle or a square having four sides and wherein each side of the peripheral frame includes a single through opening having a length greater than approximately 80% of the length of the side.

* * * * *